(12) United States Patent
Brecht

(10) Patent No.: US 11,215,641 B2
(45) Date of Patent: Jan. 4, 2022

(54) PROBE CARD ASSEMBLY IN AUTOMATED TEST EQUIPMENT

(71) Applicant: Teradyne, Inc., North Reading, MA (US)

(72) Inventor: Brian Brecht, Newbury Park, CA (US)

(73) Assignee: Teradyne, Inc., North Reading, MA (US)

( * ) Notice: Subject to any disclaimer, the term of this patent is extended or adjusted under 35 U.S.C. 154(b) by 174 days.

(21) Appl. No.: 16/726,649

(22) Filed: Dec. 24, 2019

(65) Prior Publication Data

US 2021/0190827 A1 Jun. 24, 2021

(51) Int. Cl.
*G01R 1/067* (2006.01)
*G01R 1/073* (2006.01)
*G01R 31/28* (2006.01)

(52) U.S. Cl.
CPC ..... *G01R 1/07342* (2013.01); *G01R 1/07378* (2013.01); *G01R 31/2834* (2013.01)

(58) Field of Classification Search
CPC .... G01R 1/067; G01R 1/06722; G01R 1/073; G01R 1/07342; G01R 1/07378; G01R 31/28; G01R 31/2834; G01R 31/2851; G01R 31/2889; G01R 31/302; G01R 31/319
See application file for complete search history.

(56) References Cited

U.S. PATENT DOCUMENTS

| | | | |
|---|---|---|---|
| 5,210,485 A | 5/1993 | Kreiger et al. | |
| 7,332,921 B2 | 2/2008 | Nulty et al. | |
| 2006/0250150 A1 | 11/2006 | Tunaboylu et al. | |
| 2007/0145989 A1 | 6/2007 | Zhu et al. | |
| 2009/0091343 A1 | 4/2009 | Wu et al. | |
| 2009/0176406 A1 | 7/2009 | Yaghmai et al. | |
| 2010/0164521 A1 | 7/2010 | Chen et al. | |

(Continued)

FOREIGN PATENT DOCUMENTS

| CN | 104508499 A | 4/2015 |
|---|---|---|
| CN | 104582236 A | 4/2015 |

(Continued)

OTHER PUBLICATIONS

International Search Report and Written Opinion dated Apr. 8, 2021 in connection with International Application No. PCT/US2020/064148.

(Continued)

*Primary Examiner* — Neel D Shah
(74) *Attorney, Agent, or Firm* — Wolf, Greenfield & Sacks, P.C.

(57) ABSTRACT

Probe pin arrangements in a vertical-type probe card assembly for an automated test equipment (ATE) are disclosed. In some embodiments, one or more additional conductive regions are provided in between adjacent probe pins. The additional conductive regions may reduce spacing between probe pins connected to adjacent probe card pads, and may in turn reduce or adjust inductance between the two probe cards pads to provide improved signal impedance matching or lower power impedance. In one embodiment, the additional conductive region is a short probe pin. In another embodiment, the additional conductive region is a protrusion on a vertical probe pin.

24 Claims, 7 Drawing Sheets

(56) References Cited

U.S. PATENT DOCUMENTS

| 2010/0255690 | A1 | 10/2010 | Waite et al. | |
|---|---|---|---|---|
| 2013/0027071 | A1 | 1/2013 | Canegallo et al. | |
| 2013/0033283 | A1 | 2/2013 | Wu et al. | |
| 2014/0167799 | A1* | 6/2014 | Wang .................. | H05K 1/11 324/750.14 |
| 2018/0024167 | A1 | 1/2018 | Maggioni | |

FOREIGN PATENT DOCUMENTS

| CN | 205787004 | U | 12/2016 |
|---|---|---|---|
| CN | 107367678 | A | 11/2017 |
| JP | H11-30632 | A | 2/1999 |
| JP | 2011-222928 | A | 11/2011 |
| JP | 2012-015469 | A | 1/2012 |
| JP | 2012-132685 | A | 7/2012 |
| JP | 2012-132823 | A | 7/2012 |
| JP | 2019-071420 | A | 5/2019 |
| KR | 10-2012-0076265 | A | 7/2012 |

OTHER PUBLICATIONS

International Search Report and Written Opinion dated Apr. 8, 2021 in connection with International Application No. PCT/US2020/064147.
International Search Report and Written Opinion dated Apr. 8, 2021 in connection with International Application No. PCT/US2020/064167.
International Search Report and Written Opinion dated Apr. 8, 2021 in connection with International Application No. PCT/US2020/064170.
Brecht et al., Probe Card Pad Geometry in Automated Test Equipment, U.S. Appl. No. 16/726,640, filed Dec. 24, 2019.
Brecht, Transposed via Arrangement in Probe Card for Automated Test Equipment, U.S. Appl. No. 16/726,657, filed Dec. 24, 2019.
Brecht, Coaxial via Arrangement in Probe Card for Automated Test Equipment, U.S. Appl. No. 16/726,665, filed Dec. 24, 2019.
Lee, Shape Optimization of Vertical-type Probe Needle Integrated with Floating Mount Technology. Thesis presented to University of Waterloo, Ontario, Canada. 2013. 60 pages.
PCT/US2020/064147, Apr. 8, 2021, International Search Report and Written Opinion.
PCT/US2020/064148, Apr. 8, 2021, International Search Report and Written Opinion.
PCT/US2020/064167, Apr. 8, 2021, International Search Report and Written Opinion.
PCT/US2020/064170, Apr. 8, 2021, International Search Report and Written Opinion.
U.S. Appl. No. 16/726,640, filed Dec. 24, 2019, Brecht et al.
U.S. Appl. No. 16/726,657, filed Dec. 24, 2019, Brecht.
U.S. Appl. No. 16/726,665, filed Dec. 24, 2019, Brecht.

* cited by examiner

PROBE CARD ASSEMBLY IN AUTOMATED TEST EQUIPMENT

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

In some instances, semiconductor devices are tested at the wafer level. Testing at the wafer-level has several benefits including testing and validating a device as a known good die before it is diced as a semiconductor die and packaged. A wafer may contain many devices, and permit testing of a large number of devices in close proximity to each other without having to reload another wafer, which can decrease testing time and increase manufacturing throughput.

Each device under test contains exposed connection structures such as pads or bumps, which may serve as test points at which test signals may be applied to or measured to a DUT on a wafer. An ATE interfaces with the device using a probe card assembly that contains an array of multiple probe pins. Each probe pin has a tiny probe needle on a free end that is used to make electrical contact to a test point of the DUT, with the opposite end of the probe pin electrically connected to pads on a printed circuit board, which may be part of the tester or may be part of the probe card assembly that, in turn, is electrically connected to the tester. Sometimes a probe card assembly includes more than one circuit boards stacked vertically over each other to form a probe card. Mechanical supports within the probe card assembly hold the probe pins and press the pins against the printed circuit board in the probe card, enabling contact to be made between the board and the pins. In order to make electrical contact to the wafer, a wafer prober presses the wafer against the probe needles so that the needle tips make physical and electrical contact with test points on the device. Once the probe needles have made contact with both the test points on the wafer and the pads that are electrically coupled to the tester, the testing process can begin.

SUMMARY

Disclosed herein are probe pin arrangements in a vertical-type probe card assembly for an automated test equipment (ATE). In some embodiments, one or more additional conductive regions are provided in between adjacent probe pins. The additional conductive regions may reduce spacing between probe pins connected to adjacent probe card pads, and may in turn reduce or adjust inductance between the two probe cards pads to provide improved signal impedance matching or lower power impedance. In one embodiment, the additional conductive region is a short probe pin. In another embodiment, the additional conductive region is a protrusion on a vertical probe pin.

According to some embodiments, an probe card assembly for testing a wafer having a plurality of wafer pads. The probe card assembly comprises a board having a plurality of probe card pads on a surface; a first probe pin comprising a first conductive region in contact with a first probe card pad of the plurality of probe card pads and extending in a first direction perpendicular to the surface. The first probe pin is configured to contact a wafer pad. The probe card assembly further comprises a second conductive region adjacent the first conductive region and electrically connected to the first probe card pad. The second conductive region is configured to be separated from the wafer pad by a dielectric material when the probe pin contacts the wafer pad.

According to some embodiments, a probe card assembly for testing a wafer is provided. The wafer has a plurality of wafer pads. The probe card assembly comprises a board having a plurality of probe card pads on a surface; a plurality of probe pins extending through a substrate along a first direction perpendicular to the surface; a first probe pin of the plurality of probe pins in contact with a first probe card pad of the plurality of probe card pads. The first probe pin has a needle configured to contact a first wafer pad of the plurality of wafer pads. a second probe pin of the plurality of probe pins is adjacent the first probe pin. The second probe pin is in contact with a second probe card pad of the plurality of probe card pads, and has a needle configured to contact a second wafer pad of the plurality of wafer pads. The probe card assembly further comprises a conductive region adjacent the first probe pin. The conductive region is electrically connected to the first probe card pad, and configured to be separated from the first wafer pad by a dielectric material when the first probe pin contacts the first wafer pad.

According to some embodiments, an interposer for an automated test equipment (ATE) is provided. The interposer comprises of a substrate having a first surface and a second surface offset in a first direction from the first surface; a plurality of spring pins within the substrate and elongated in the first direction. A first portion of the plurality of spring pins comprises a first inductance; a second portion of the plurality of spring pins comprises a second inductance higher than the first inductance. The first portion comprises a conductive region separated from the first surface by a dielectric material.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
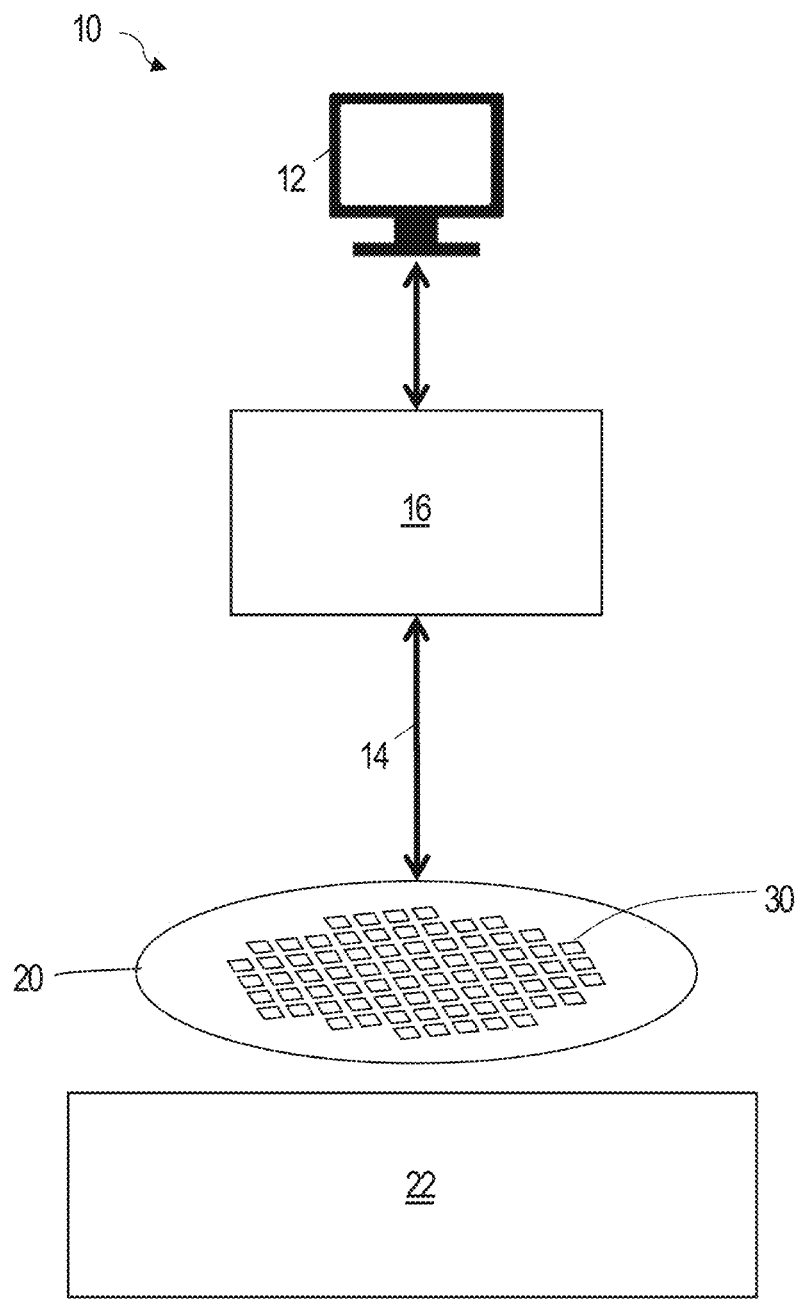
FIG. 1 is a high-level schematic diagram of an exemplary test system according to aspects of the present application.

In vertical-type probe card assemblies, an array of probe pins are each arranged perpendicularly, or "vertically" from a wafer surface, with free ends of the probe pins used to contact wafer pads the wafer. The wafer pads serve as test points during testing of a DUT on the wafer. Probe pins in such a vertical-type probe card assembly are mechanically held within one or more guide plates and arranged generally with the same pitch as wafer pads on the DUT such that a probe needle at the free end of each probe pin will land on a corresponding wafer pad during testing. The opposite ends of the probe pins are each in contact with a corresponding probe card pad on a surface of a circuit board that is part of a probe card within the probe card assembly. The probe card pads and probe pins serve to electrically interface test points on the DUT with circuitry in the rest of the tester via the circuit board in the probe card.

Aspects of the present application are directed to a novel probe pin arrangement within a probe card assembly, such that the inductance between adjacent vertical probe pins may be reduced to provide a desirable impedance during high frequency signal transmission. The inventor has recognized that the relatively long and narrow geometry of vertical probe pins would tend to increase inductance between adjacent probe pins. When high frequency data signal and power signal are transmitted in the probe pins, the inter-probe pin inductance may increase an impedance of the signal path through the probe pins. When the probe pin impedances are much higher than impedances of components on the DUT, which is typically 50Ω single ended and/or 100Ω differential, a large impedance mismatch is created in the signal path from the probe pins to and from the components in electrical contact with the probe pins, which causes undesirable signal reflections as the frequency's wavelength approaches the electrical length of the probe pins.

In some embodiments, an additional conductive region is provided in between a first and a second probe pins. The first/second probe pin is configured to connect a first/second probe card pad to a corresponding first/second wafer pad on the DUT. The inventor has recognized that the additional conductive region reduces spacing between the first and second probe pin, and may serve to screen a portion of the electric fields between the two probe pins, thus reducing inductance between the first and second probe card pads compared to implementations without an additional conductive region.

In some embodiments, the first probe pin may be considered a first conductive region, and the additional conductive region is a second conductive region adjacent the first conductive region. In some embodiments, the second conductive region is electrically connected to the first probe card pad. The inventor has recognized that as the second conductive region reduces the spacing between probe pins in contact with the first and second probe card pad, a resulting increase in capacitive coupling between probe pins connecting to the two probe card pads will further reduce impedance and contribute to an improved impedance matching between probe pins and the components to be tested.

Aspects of the present application can be implemented without requiring changes to the wafer pad size and spacing arrangement on the DUT. In some embodiments, the second conductive region will not make contact with the first wafer pad when the first probe pin is brought to be in contact with the first wafer pad. In such embodiments, the second conductive region is configured to be separated from the first wafer pad by a dielectric material when the first probe pin is brought to be in contact with the first wafer pad. Accordingly, there is no requirement to enlarge the first wafer pad to accommodate the additional conductive region introduced between probe pins, and probe card assemblies in accordance with embodiments described herein may be used to test existing wafers and provide improved impedance matching.

In some embodiments, the second conductive region is part of a short probe pin having a first end that is in contact with the first probe card pad, while the second end of the short probe pin does not reach the first wafer pad when the first probe pin contacts the first probe card pad and the first wafer pad. The first wafer pad may be shaped to accommodate contact from both the first probe pin and the short probe pin. The short probe pin extends from the first probe card pad towards the wafer, and is disposed between the first and second probe pin such that inductance between the first and second probe pin is reduced, while increasing capacitive coupling between the first and second probe card pads. In some embodiment, the short probe pin is held in a partially-filled hole in the guide plate, with a dielectrically material at an end of the partially-filled hole serving as support for the short probe pin and dielectrically separates the short probe pin from the first wafer pad.

In other embodiments, the first probe pin is shaped to have a protrusion laterally along a direction parallel to the surface of the circuit board of the probe card, and sometimes referred to as a "fat probe pin." In such embodiments, the second conductive region is part of the protrusion, and the protrusion extends closer towards the second probe pin, such that the spacing between the first and second probe pins are reduced, and thus inductance between the first and second probe pin is reduced, while increasing capacitive coupling between the first and second probe card pads.

The aspects and embodiments describes above, as well as additional aspects and embodiments, are described further below. These aspects and/or embodiments may be used individually, all together, or in any combination of two or more, as the application is not limited in this respect.

FIG. 1 is a high-level schematic diagram of an exemplary test system according to aspects of the present application. FIG. 1 illustrates a test system 10 that contains a test computer 12 that controls a tester 16 to perform tests on a device under test (DUT) 30 in accordance to methods disclosed in the present application. In some scenarios, the tester 16 may be an automated test equipment (ATE), constructed using techniques that are known in the art. The DUT 30 may be any suitable device for testing. For example, DUT 30 may be a semiconductor die disposed on a surface of a wafer 20. In some embodiments, DUT 30 may be an un-diced semiconductor die, along with a plurality of similar dies that are also on the wafer 20 for testing with ATE 16. ATE 16 may contain circuitry to generate and/or measure a test signal 14 for DUT 30. ATE 16 may include multiple instruments configured to generate or measure different types of analog or digital signals. Wafer 20 may be held by and moved into contact with ATE 16 via a wafer prober 22. Wafer prober 22 may also provide other functions, such as establishing temperature conditions for testing devices on a wafer.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 30 is operating correctly. A probe card may be provided within ATE 16 to connect test points on the DUT to corresponding test points of instruments within ATE 16. Also, FIG. 1 illustrates a single signal path between ATE 16 and DUT 30. One of skill in the art will appreciate that testing a DUT such as devices on a semiconductor wafer may require hundreds or thousands of test signals to be generated and measured. Accordingly, circuitry as described herein may be duplicated many times within ATE 16 and controlled to provide synchronized test signals for testing DUT 30. Further, though FIG. 1 illustrates a scenario in which a single DUT 30 is being tested, test system 10 may be configured to test multiple devices.

Regardless of the number of instruments or other components generating or measuring test signals and the number of devices under test, test system 10 may include signal delivery components that route the signals between the DUT 30 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
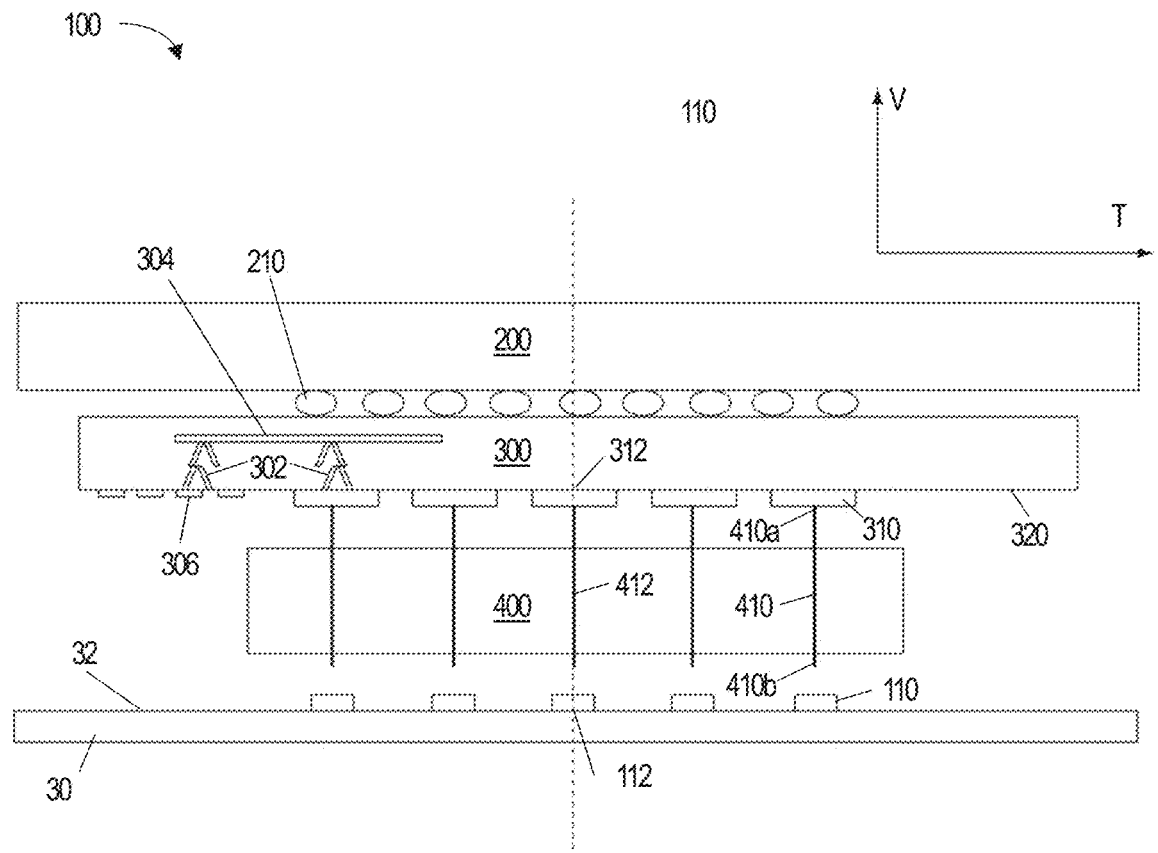
FIG. 2 is a schematic diagram of a probe card assembly 100, in accordance with some embodiments.

FIG. 2 is a schematic diagram of a probe card assembly 100, in accordance with some embodiments. Probe card assembly 100 may be a probe card assembly that is used in ATE 16 as shown in FIG. 1 to interface instruments within the ATE to DUT 30.

As shown in FIG. 2, probe card assembly 100 includes a first circuit board 200, a second circuit board 300, a guide plate 400 with multiple probe pins 410 disposed inside. The first circuit board 200 is stacked vertically over and electrically connected to the second circuit board 300, for example via an array of solder bumps 210, although any other suitable connections may be made between the two circuit boards. The two circuit boards 200, 300 may be part of a probe card within the probe card assembly 100. The second circuit board 300 has a plurality of probe card pads 310 disposed on a surface 320 facing the DUT 30. Probe card pads 310 are electrically connected to top ends 410a of probe pins 410, where each probe pin 410 has a probe needle at the free end 410b positioned to be in contact with a corresponding wafer pad 110 on the DUT 30. Probe card 100 may be configured to test a specific DUT with a specific arrangement of wafer pads 110, and different probe cards may be used for different DUTs. Probe card 100 may be removably attached to the rest of the ATE 10. Attachment mechanisms are known in the art and are not shown for simplicity.

DUT 30 may be one of an array of DUTs on a wafer 20 as shown in the example in FIG. 1, and one or more of the DUTs may be concurrently tested during manufacturing for quality assurance. A DUT 30 may be a semiconductor die that has an array of wafer pads 110 exposed from an insulative surface 32 that are connected with interconnects and semiconductor components disposed within DUT 30 (not shown) below the insulative surface. While wafer pad 110 is illustrated as a metal pad, it should be appreciates that aspects of the present application are not so limited and that any suitable implementation of a test point on a semiconductor wafer may be used, such as a portion of a metal trace, a solder bump, or a suitable conductive structure known in the art. A DUT 30 may have a large number of test points, such as at least 500, at least 1,000, or between 500 and 10,000 test points arranged on the insulative surface 32 in any suitable type of grid array. Alternatively, a DUT may have a small number of test points, in which case connections may be made to multiple DUTs on the same wafer for simultaneous testing of multiple DUTs. In either case, there may be an array of test pads to which connections are made. For simplicity of discussion, a single DUT will multiple test points will be used as an example, but it should be appreciated that other configurations are possible. Examples of grid arrays include a concentric array, a hexagonal close packed array, an orthogonal array, or a mixture thereof. Each test point may also have any suitable shape, such as but not limited to rectangular, circular, oval. The test point array has a centroid 112 that corresponds to a geometrical center of the array of wafer pads 110 when viewed from a vertical direction (V) normal to the insulative surface 32.

Probe pins 410 may be of a vertical-type probe pin design, where each probe pin is oriented in use substantially vertically with the wafer to be probed. Each probe pin 410 may be formed from metal wire or plated micro-electromechanical systems (MEMS) having any suitable cross-sectional shape. While FIG. 2 illustrates that the probe pin is straight, it should be appreciated that each probe pin 410 may have a slight curvature in at least a section of the probe pin that forms a compliant spring when the probe pin is compressed between the probe card pad 310 and a wafer pad 110 on the DUT. In some embodiments, the slightly curved probe pin may be referred to as a Cobra pin, although other probe pin configurations known in the field may be suitable.

Guide plate 400 has a plurality of guide holes in which individual probe pins 410 are fitted. The guide holes are arranged in an array that aligns with the specific wafer pad array 110 on the DUT, such that the probe needles 410b of probe pins 410 can land on and make electrical contact with each corresponding wafer pads 110 during testing. In some embodiments, guide plate 400 may be considered an interposer that sits between second circuit board 300 and the DUT 30, and serves to interface routing between probe card pads 310 and wafer pads 110 on the DUT 30 by a plurality of probe pins 410. Interposer 400 may comprise a semiconductor substrate that includes an insulative material, such as a dielectric material. It should be appreciated that guide plate 400 is depicted in FIG. 2 as a unitary member for the simplicity of illustration only, and aspects of the present application may also apply to a guide plate that comprises multiple components. For example, the guide plate 400 may comprise two or more plates stacked along the vertical direction, each plate in parallel to the surface 32 of DUT 30.

During manufacturing of probe card assembly 100, guide plate 400 may be mechanically fastened to the second circuit board 300 via one or more mechanical fasteners (not shown) such that the array of probe card pads 310 and array of probe pins 410 are in contact.

Probe card pads 310 are formed of one or more layers of conductive material such as metal, and are arranged in an array that generally aligns to the array of probe pins 410 and the wafer pads 110, such that each top end 410*a* contacts a corresponding probe card pad 310, when a center of the pads 312 is aligned with the center 412 of the probe pin array. The center 312 of the pad array 310 may be computed as a centroid 312 of the pads in the array. Each probe card pad 310 may be of any suitable shape and spatial arrangement known in the art.

The second circuit board 300 may comprise a dielectric body, with an array of pads 310 disposed on a surface 320 of the dielectric body that is facing the DUT. Second circuit board 300 may be a printed circuit board (PCB) or a printed wire board. In some embodiments, second circuit board 300 may be formed of multiple layers of organic materials, such as a polymer, and may be referred to as a multi-layer organic (MLO) board.

Some of the probe card pads are configured to carry test signals to corresponding test points on a wafer and may be referred to as "signal pads," while some other probe card pads are configured to provide a reference voltage such as ground or power to the wafer, and may be referred to as "ground pads" or "power pads," respectively. In some embodiments, the test signals, power and ground voltages are provided to signal pads, ground pads and power pads via interconnection structures within the second circuit board 300. The interconnection structures couple respective probe card pads to the rest of the test system via for example solder bumps 210 and the first circuit board 200.

FIG. 2 illustrates via structures 302 and trace 304 that can be part of interconnection structures embedded within second circuit board 300. In the example shown in FIG. 2, via structures 302 are conductive structures that extend vertically to interconnect a probe card 310 on surface 320 of board 300 to another conductive structure disposed in a different plane parallel to but offset vertically from surface 320, such as trace 304. Traces 304 are conductive structures that extend transversely within board 300. It should be appreciated that while only one layer of trace 304 is shown in FIG. 2 for simplicity, embodiments of the present application is not so limited and a plurality of traces 304 may be provided within board 300 and disposed in more than one transverse planes to interconnect components laterally within the board 300. Similarly, a plurality of via structures 302 may be provided to interconnect a trace with one or more probe card pads 310 on surface 320, or to interconnect a trace with solder bumps 210 in between boards 200 and 300.

The test signals carried on signal pads may be signals generated within the wafer and measured from test points on the wafer, or externally generated stimulus signals provided to test points on the wafer. In some embodiments, the test signals may be a radio frequency signal having a frequency of at least 10 MHz, at least 100 MHz, at least 1 GHz, at least 10 GHz, between 1 GHz and 100 GHz, between 10 GHz and 60 GHz, or of any other frequency range suitable for semiconductor devices to be tested under a probe card assembly.

The power pads may supply external power from the tester to components on the wafer. The supplied power may be direct current (DC) power, as well as alternative current (AC) power. In some embodiments, AC power may be provided to components on the wafer at a frequency of at least 10 MHz, at least 100 MHz, at least 1 GHz, at least 10 GHz, between 10 MHz and 10 GHz, between 50 MHz and 5 GHz, or of any other frequency range suitable for semiconductor devices to be tested under a probe card assembly. Probe pins that are in contact with power pads on the board 300 may carry higher amounts of DC or AC currents than probe pins for signal pads. Some of the supplied DC or AC currents may flow through a conductive path from a power pad on the probe card circuit board, to a probe pin connected to the power pad, to a corresponding wafer pad on the wafer under test, to components within the wafer under test, and return to one or more grounds pads on the probe card circuit board via corresponding probe pins and wafer pads.

In some embodiments, circuit boards within a probe card can have additional components that can process or condition signals on the probe card pads. The additional components may be passive components, such as but not limited to discrete resistors, capacitors, inductors, or any suitable combination thereof. In the example illustrated in FIG. 2, bypass capacitors or decoupling capacitors 306 are disposed on surface 320 of the second circuit board 300, for example by surface-mounting. Bypass capacitors 306 are connected to power pads 310 via planes 304 and via structures 302 to filter out non-DC components in a DC power supply voltage. Depending on the application, various other types of additional components may be provided, including active circuitry such as a semiconductor chip. Any suitable packaging techniques known in the art may be used to provide the additional components on circuit boards within a probe card, such as but not limited to mounting on an exterior surface, or embedded within the interior of one or more circuit boards.

High frequency transient power is supplied either from the tester, bypass capacitors, or from components on the wafer under test itself. In some embodiments, the wafer may be tested in a loop back configuration, where high frequency digital, analog or power signals are transmitted form a current path that originates from components at a first region on the wafer under test, upwards via a wafer pad and corresponding probe pin to a first probe card pad, routed via one or more traces, planes and vias within a circuit board in the probe card to a second probe card pad, and then to components at a second region on the wafer under test via its corresponding wafer pad and a probe pin connected to the second probe card pad.

Regardless of how signals and power are assigned to the array of probe card pads in the probe card assembly, the inventor has recognized that when high frequency test signals and high frequency transient power signals are transmitted via the vertical probe pins such as probe pins 410 to the DUT, high impedance from the probe pins having high inductance may lead to undesirable impedance mismatch and signal loss at the wafer. To solve this problem, aspects of the present application are directed to providing an additional conductive region between adjacent probe pins, as described in more detail below.

Figure 3A:
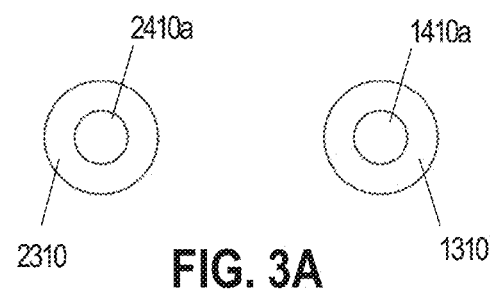
FIG. 3A is a partial top view diagram of the bottom surface of circuit board as shown in FIG. 3B.
Figure 3B:
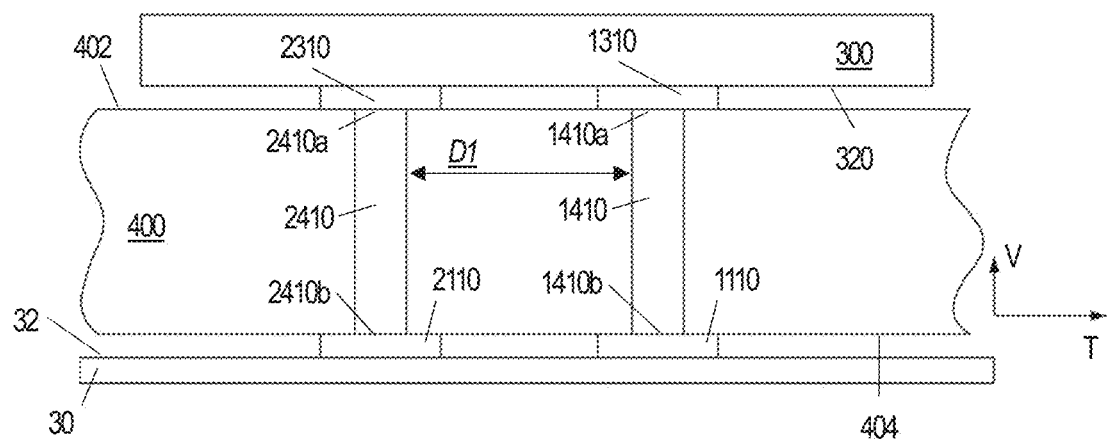
FIG. 3B illustrates a cross-sectional view of components arranged between a DUT and a circuit board within a probe card assembly as shown in FIG. 2, in accordance with an embodiment without an additional conductive region between adjacent probe pins.

FIG. 3B illustrates a cross-sectional view of components arranged between DUT 30 and the circuit board 300 within probe card assembly 100 as shown in FIG. 2, in accordance with an embodiment without an additional conductive region between adjacent probe pins.

FIG. 3B illustrates a configuration when the probe card assembly is brought to be in electrical contact with the DUT 30 for operating of the tester to test DUT 30. In FIG. 3B, a first probe card pad 1310 disposed at the bottom surface 320 of circuit board 300 is physically and electrically contacted by top end 1410a of a first probe pin 1410, while the bottom end 1410b physically and electrically contacts a first wafer pad 1110 on a top surface 32 of DUT 30. Similarly, a second probe card pad 2310 disposed at the bottom surface 320 of circuit board 300 is physically and electrically contacted by top end 2410a of a second probe pin 2410, while the bottom end 2410b physically and electrically contacts a second wafer pad 2110 on the top surface 32 of DUT 30.

It should be appreciated that while only a pair of probe pins and a handful of pads are illustrated, such depiction is for simplicity and illustrative purpose only and embodiments of the present application may have any number of like components in a probe card assembly.

Probe pins 1410 and 2410 may be adjacent each other and have no other probe pins in between. In some embodiments, each of probe pins 1410 and 2410 is a vertical-type probe pin made of metal, and the top ends 1410a, 2410a have spring contacts for making electrical connection to respective probe card pads 1310, 2310. The bottom ends 1410b, 2410b have probe needles positioned to contact corresponding wafer pads 1110, 2110. Probe pins 1410, 2410 may have any suitable cross-sectional shape and in some embodiments, may be cylindrical wires or plated MEMS with outer diameter of about 10 to 100 µm, such as 30 µm in an example. Any suitable form of probe needles may be provided at the bottom ends to provide a compliant contact with a wafer pad. Each probe pin 1410, 2410 may have a height in the vertical direction of about 1 to 10 mm, such as 6 mm.

FIG. 3A is a partial top view diagram of the bottom surface 320 of circuit board 300 as shown in FIG. 3B. FIG. 3A illustrates an embodiment where each of the probe card pads 1310, 2310 has a circular shape, although it should be appreciated that aspects of the application should not be so limited and any shape and size that are manufacturable using fabrication techniques known in the art for the probe card pads may be used. In the example shown in FIG. 3A, each probe card pad may have a circular shape having a diameter of about 50 to 200 µm, such as 70 µm. The probe card pads 1310, 2310 may comprise copper, nickel, gold, and other metals. Each of probe card pads 1310, 2310 may be configured as a power pad, a ground pad, or a signal pad Probe pins 1410 and 2410 are spaced such that their top ends 1410a, 2410a contact the center of respective probe card pads 1310, 2310, with a center to center spacing of probe pins 1410, 2410 are about 50 to 250 µm, such as 125 to 130 µm. In the example where the probe card pads have an about 70 µm diameter, the probe pins have an about 30 µm diameter with an about 130 µm center-to-center spacing, the nearest spacing D between adjacent probe pins 1410, 2410 along the transverse direction is about D1=130−30=100 µm. Wafer pads 1110, 2110 may be similar in dimension and center-to-center spacing as the probe card pads, and have probe needles 1410b, 2410b that approximately lands on respective center of the wafer pads during testing.

The probe pins 1410, 2410 may be held in holes provided in guide plates 400. Guide plate 400 may be formed of a dielectric material, and may also be referred to as an interposer having a top surface 402 and a bottom surface 404. Probe pins 1410, 2410 may be referred to as spring pins disposed in the interposer 400 and extend from top surface 402 to bottom surface 404.

In FIG. 3B, there is a inductance L1 between the adjacent probe pins 1410 and 2410, and that such inductance L1 contributes to path inductance on signals or power delivered through probe card pads 1310, 2310 in the configuration as shown in FIG. 3B. The inventor has appreciated and recognized that inductance L1 depends on the composition and dimension of the dielectric material separating the probe pins, and generally increases as D1 increases. The dielectric material between probe pins may be air, or may be a solid dielectric material. In some embodiments, the dielectric material between probe pins is the same dielectric material of the guide plate 400.

The inventor has also recognized that while D1 can be decreased to reduce the inductance L1, in some situations the center-to-center spacing of probe pins may be dictated by the design of wafer pads 1110, 2110 due to the need for each of probe pins 1410, 2410 to align with and contact the wafer pads. There are various limitations preventing wafer pads 1110 to become closer, such as but not limited to inflexibility to alter DUT design by a customer of the tester, or patterning tolerance and resolution limitations in the manufacturing process for wafer pads preventing shrinking of the pad pitches.

Figure 4A:
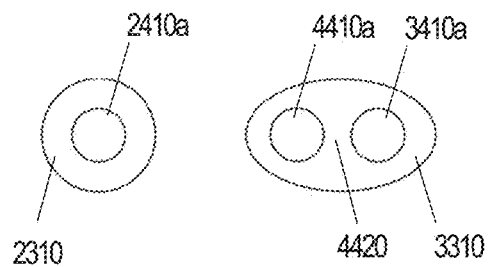
FIG. 4A is a partial top view diagram of the bottom surface of circuit board as shown in FIG. 4B.
Figure 4B:
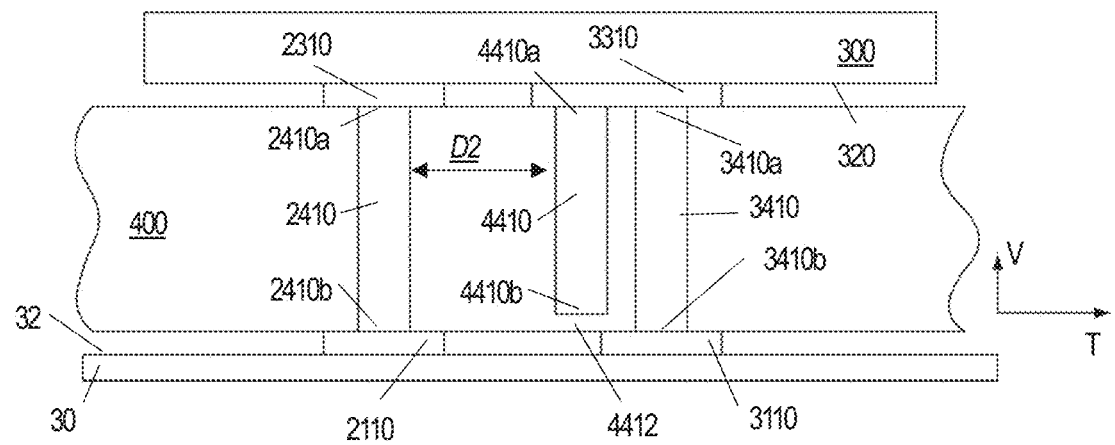
FIG. 4B illustrates a cross-sectional view of an exemplary implementation of a probe card assembly having additional conductive region between adjacent probe pins, in accordance with some embodiments.

FIG. 4B illustrates a cross-sectional view of an exemplary implementation of a probe card assembly having additional conductive region between adjacent probe pins, in accordance with some embodiments. The same reference number is used in FIG. 4B to refer to an identical component that appears in preceding figures.

In FIG. 4B, probe needle 3410b of first probe pin 3410 may be regarded as a conductive region that extends vertically towards and in contact with the first wafer pad 3110. An additional conductive region is implemented as a vertical pin 4410 adjacent a first probe pin 3410, and in between first probe pin 3410 and a second probe pin 2410. First probe pin 3410 contacts first probe card pad 3310 via a top end 3410a, and contacts a first wafer pad 3110 via a bottom end 1410b. Similarly, second probe pin 2410 contacts second probe card pad 2310 via a top end 2410a, and contacts a second wafer pad 2110 via a bottom end 2410b.

Pin 4410 is electrically connected to the first probe card pad 3310, but does not contact the first wafer pad 3110 as its vertical length is shorter than that of first probe pin 3410 that connects first probe card pad 3310 with first wafer pad 3110. Thus pin 4410 may also be referred to as a "short pin" or an "extra pin." Short pin 4410 may be shorter than first probe pin 3410 by 0.2 mm, 0.5 mm, 1 mm, between 0.2 and 2 mm, or any suitable amount. In one example where the first probe pin has a vertical length of 6 mm, short pin 4410 may have a vertical length of 5 mm.

A free end 4410b of short pin 4410 faces the DUT 30, but is separated from first wafer pad 3110 by a dielectric 4412. Dielectric 4412 may be any suitable insulative dielectric material, including air or a solid dielectric material known in the art. In some embodiments, short pin 4410 is constructed of the same metal cylindrical wire or plated MEMS and of similar cross-sectional dimension as probe pin 3410, and has a spring contact at top end 4410a for contacting the first probe card pad 3310. In such embodiments, the free end 4410b may be physically supported by the dielectric material that made up the guide plates or interposer 400. For example, guide plates 400 may comprise a partially-filled hole that fits and physically supports short pin 4410, such that the free end 4410b rests on the dielectric material at the bottom of the partially-filled hole.

A projection of short pin 4410 along the vertical direction on the surface 32 of wafer 30 may be partially or entirely outside the boundary of wafer pad 3110, as shown in FIG. 4B. This is because the wafer pad 3110 may not have a surface area that is big enough to accommodate both pins 3410 and 4410. The inventor has recognized that because short pin 4410 is not contacting first wafer pad 3110, there is no need to redesign the pad pattern on the DUT to accommodate the probe card assembly having a short pin in accordance with some embodiments in this application, and compatibility with existing wafers under test can be maintained.

FIG. 4A is a partial top view diagram of the bottom surface 320 of circuit board 300 as shown in FIG. 4B. Because first probe card pad 3310 is contacted by two probe pins: first probe pin 3410 and short pin 4410, the shape of probe card pad 3310 is elongated along a long axis parallel to a transverse direction from first probe pin 3410 towards second probe pin 2410 to accommodate the contact springs from both short pin 4410 and first probe pin 3410, as shown in FIG. 4A. In one example, probe card pad 3310 may have a length of 110 µm along the long axis, and a width of 70 µm along a short axis normal to the long axis. It should be appreciated that while an oval shape is shown for first probe card pad 3310, any suitable shape that can maintain contact with top ends 4410a and 3410a may be used.

Referring back to FIG. 4B, with the presence of short pin 4410, a nearest distance D2 between the probe pin 2410 and short pin 4410 is smaller than the distance between probe pins 2410 and 3410 when the conductive region 4410 is not present. As a result of such a reduction in distance between probe pins, inductance L2 on signals and power transmitting through probe card pads 2310, 3310 as shown in FIG. 4B is smaller compared to inductance L1 on signals and power transmitting through probe card pads 2310 and 1310 as shown in FIG. 3B. As a further result, capacitive coupling between probe card pads 2310 and 3310 is increased. The combined effect of the increase in capacitance and decrease in inductance may lead to a reduced impedance that can better match that of other components on the DUT. In some embodiments, D2 in FIG. 4B may be made significantly smaller than D1 as shown in FIG. 3B. For example, D2 may be 50 µm or less. In one example, short pin 4410 is separated from first probe pin 3410 by a gap 4420 of 10 µm in width, with D2 being 50 µm.

Figure 4C:
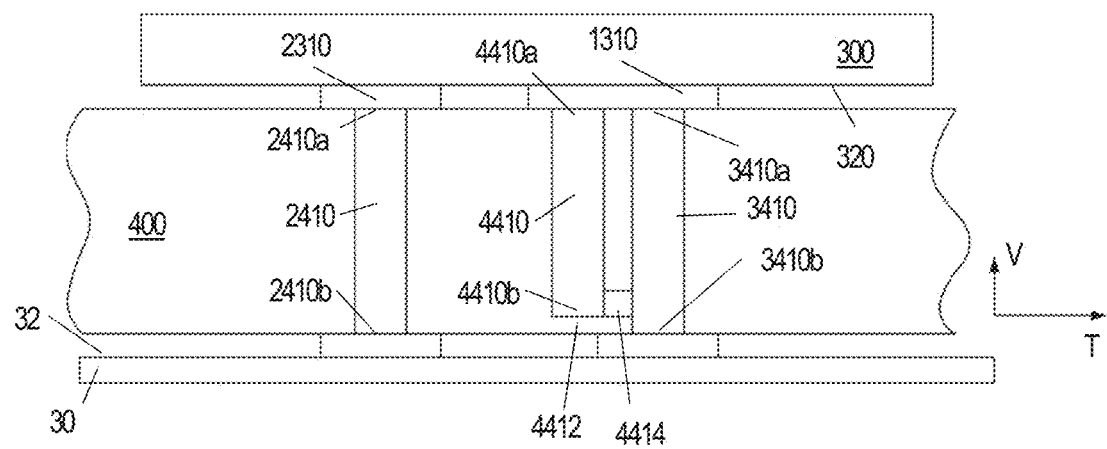
FIG. 4C is a cross-sectional view diagram of an embodiment that is a variation of the probe card assembly shown in FIG. 4B.

FIG. 4C is a cross-sectional view diagram of an embodiment that is a variation of the probe card assembly shown in FIG. 4B. In FIG. 4C a bridge 4414 may be provided that connects bottom end of first probe pin 3410b to the free end 4410b of the short pin 4410, such that an electrical current may flow between the two ends. Electromagnetic resonance at the unterminated stub in the free end 4410b may have an effect on the impedance in the probe card assembly, and such resonance may be eliminated by adding of a bridge to electrically short the free end 4410b to the adjacent probe pin 3410.

Figure 5A:
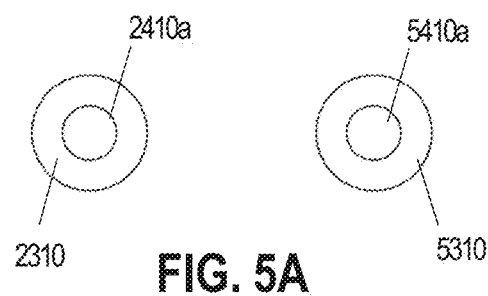
FIG. 5A is a partial top view diagram of the bottom surface 320 of circuit board 300 as shown in FIG. 5B.
Figure 5B:
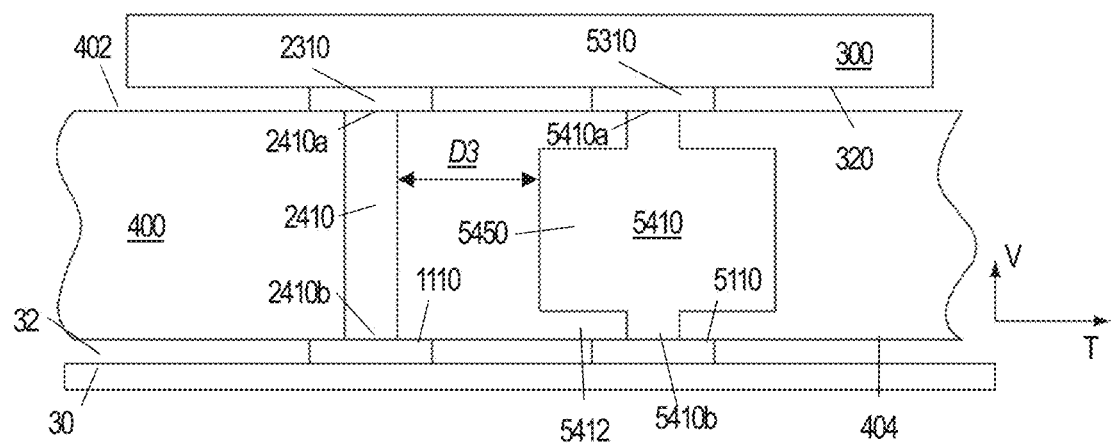
FIG. 5B illustrates a cross-sectional view of another exemplary implementation of a probe card assembly having additional conductive region between adjacent probe pins, in accordance with some embodiments.

FIG. 5B illustrates a cross-sectional view of another exemplary implementation of a probe card assembly having additional conductive region between adjacent probe pins, in accordance with some embodiments. The same reference number is used in FIG. 5B to refer to an identical component that appears in preceding figures.

In FIG. 5B, a first probe pin 5410 is provided that connects first probe card pad 5310 with a first wafer pad 5110. Probe pin 5410 has a first conductive region in the form of a probe needle 5410b at a bottom end of the probe pin for contacting the first wafer pad 5110. Probe pin 5410 has a second conductive region in the form of a protrusion 5450 that extends transversely towards a second probe pin 2410, such that a nearest distance D3 between first probe pin 5410 and second probe pin 2410 is smaller than the distance between probe pins 5410 and 2410 when the protrusion 5410 is not present and when probe pin 5410 has a uniform width across its length.

As a result of such a reduction in distance between probe pins, inductance L3 between probe card pads 2310, 5310 as shown in FIG. 5B is smaller compared to inductance L1 on signals and power transmitting through probe card pads 2310 and 1310 as shown in FIG. 3B. As a further result, capacitive coupling between probe card pads 2310 and 5310 is increased. The combined effect of the increase in capacitance and decrease in inductance may lead to a reduced impedance that can better match that of other components on the DUT. In some embodiments, D3 in FIG. 5B may be made significantly smaller than D1 as shown in FIG. 3B. For example, D3 may be 50 µm or less.

Protrusion 5450 is not in contact with first wafer pad 5110, and instead is separated from first wafer pad 5110 by a dielectric material 5412 that in many aspects may be similar to dielectric 4412 as shown in FIG. 4B. A projection of protrusion 5450 along the vertical direction on the surface 32 of wafer 30 may be partially or entirely outside the boundary of wafer pad 5110. As protrusion 5450 is not contacting first wafer pad 5110, there is no need to redesign the pad pattern on the DUT to accommodate the probe card assembly having a protrusion on a probe pin in accordance with some embodiments.

In some embodiments, the bottom end of first probe pin 5410b may be a needle having a circular cross section, and protrusion 5410 may be a cylindrical wire or plated MEMS that has an enlarged diameter compared to the diameter of probe needle 5410b. In the example shown in FIG. 5B, protrusion 5410 is aligned concentrically with the probe needle 5410b, such that a protrusion appears on both lateral sides of probe needle 5410b. Such an embodiment may sometimes be referred to as a "fat probe pin," where a cross section through a vertical axis of probe pin 5410 shows a rectangular shape for the protrusion 5450, as shown in FIG. 5B.

Having protrusions extending circumferentially across multiple directions may provide improved inductive and capacitive characteristics with respect to probe pin pairs along multiple directions, although it should be appreciated that it is not a requirement that the protrusion be part of a "fat probe pin" or axially symmetrical. Regardless of the geometry of the protrusion, first probe pin 5410 may be disposed in guide plate 400 and in some embodiments be physically supported by the dielectric material that makes up guide plate 400. For example, guide 400 may comprise a through hole that is shaped to fit probe pin 5410 with protrusion 5450.

Protrusion 5450 as a conductive region is electrically connected to the first probe card pad 5310 via a top end 5410a of probe pin 5410. Top end 5410a may be a cylindrical wire or plated MEMS, and may have a spring for contacting the probe card pad 5310.

In some embodiments, top end 5410a may have a diameter that is significantly smaller than the width of protrusion 5450, such that there is no need to enlarge the probe card pad 5310 to accommodate more than one probe pins, simplifying the manufacturing process for the circuit board 300. It should be appreciated that the shape and dimension of protrusion 5450 may be designed for a variety of purposes. In some embodiments, 5450 may have a slit or reduced metal zones to provide suitable spring rates for compliance. Furthermore, a width of 5450 can be adjusted to meet a desired impedance.

FIG. 5A is a partial top view diagram of the bottom surface 320 of circuit board 300 as shown in FIG. 5B, and shows that the shape of probe card pad 5310 may be substantially similar to the shape of probe card pad 2310. Probe card pads 5310 and 2310 may be made in substantially identical shapes and having similar spacing as probe card pads 2310 and 1310 as shown in FIG. 3A, when top end 5410a is made to have the same shape as top end 2410a.

Referring back to FIG. 5B, first probe card pad 5310 may be a ground or power pad that is expected to carry a high amount of current during testing. In some embodiments, second probe card pad 2310 may be a signal pad, and its corresponding probe pin 2410 does not have a protrusion, an adjacent short probe pin, or any other additional conductive region on the same probe card pad. Such an arrangement to have additional conductive region only on power or ground pads, and not signals pads may save manufacturing cost for the probe card assembly, given that the amount of signal pads and corresponding probe pins may be much greater than power/ground pads and the corresponding probe pins.

Having described examples of both the extra pin implementation as shown in FIG. 4B and the fat pin implementation as shown in FIG. 5B, it should be appreciated that the location, shape and dimension of the components may be varied to provide any number of desirable characteristics. For example, the location of the extra pin or a width of the extra pin or a fat pin may be adjusted to provide a desired signal impedances (e.g. 50 or 100Ω). The inventor has recognized that without an extra pin or a fat pin, impedance of the probe pins will vary when the wafer pad pitches change. According to an aspect of the present application, as wafer pad pitches change, the extra pin or fat pin can be designed to keep the signal to ground ratio constant.

Figure 6A:
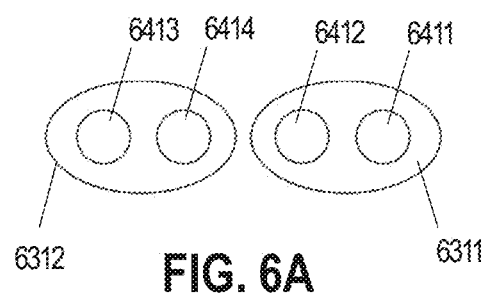
FIG. 6A is a partial top view diagram circuit board as shown in FIG. 6B.
Figure 6B:
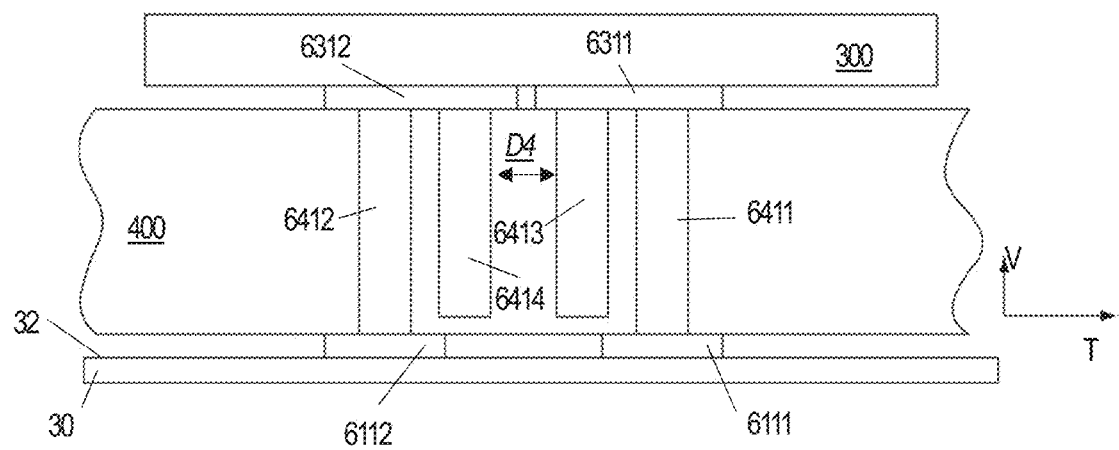
FIG. 6B illustrates a cross-sectional view of a variation of the embodiment shown in FIG. 4B, in accordance with some embodiments.

FIG. 6B illustrates a cross-sectional view of a variation of the embodiment shown in FIG. 4B, in accordance with some embodiments. In FIG. 6B, a first probe pin 6411 connects a first probe card pad 6311 with a first wafer pad 6111, while a second probe pin 6412 connects a second probe card pad 6312 with a second wafer pad 6112. A first conductive region 6413 and a second conductive regions 6414 are provided in between first and second probe pins 6411, 6412, with first conductive region 6413 adjacent first probe pin 6411 and electrically connected to first probe card pad 6311. Second conductive region 6414 is adjacent second probe pin 6412 and electrically connected to second probe card pad 6312.

Providing two conductive regions in between probe pins can further reduce the distances between probe pins electrically connected to the two probe card pads. In one example, a nearest distance D4 between conductive regions 6413 and 6414 may be 20 μm or less.

In the embodiment shown in FIG. 6B, first conductive region 6413 is a second probe pin that is parallel to but shorter than the first probe pin 6411. For example, first probe pin 6411 may have a length of 6 mm, while second probe pin may have a length of 5 mm and only contacts the first probe card pad 6311 on top, and is separated from the first wafer pad 6111 at the bottom by a dielectric material. A gap between the first probe pin 6411 and the second probe pin 6412 may be 10 μm or less. Similarly, second conductive region 6414 may be a fourth probe pin that is parallel to but shorter than the second probe pin 6412.

FIG. 6A is a partial top view diagram circuit board 300 as shown in FIG. 6B. In such an embodiment, because short probe pins 6413, 6414 are not in contact with the wafer pads 6111, 6112, no redesign is needed to alter the pad pattern on the DUT 30. Because each probe card pads 6311, 6312 is contacted by two probe pins, the shape of probe card pads 6311, 6312 may be elongated along a long axis parallel to a transverse direction from first probe pin 6411 towards second probe pin 6412 to accommodate the contact springs from both short pin 6413 and short pin 6414, as shown in FIG. 6A. It should be appreciated that while an oval shape is shown for each of probe card pads 6311 and 6312, any suitable shape that can maintain contact with two probe pins may be used.

According to an aspect, probe card pads 6311, 6312 as shown in FIG. 6A may be ground or power pads, where the reduced inductance can help improve the impedance to be closer to the desired impedance values.

Figure 7A:
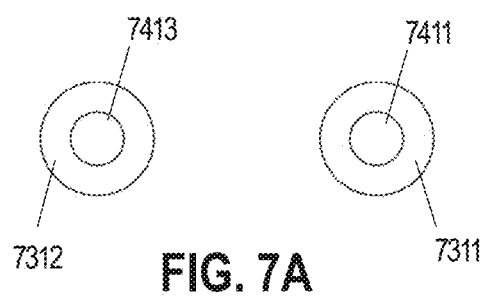
FIG. 7A is a partial top view diagram circuit board 300 as shown in FIG. 7B.
Figure 7B:
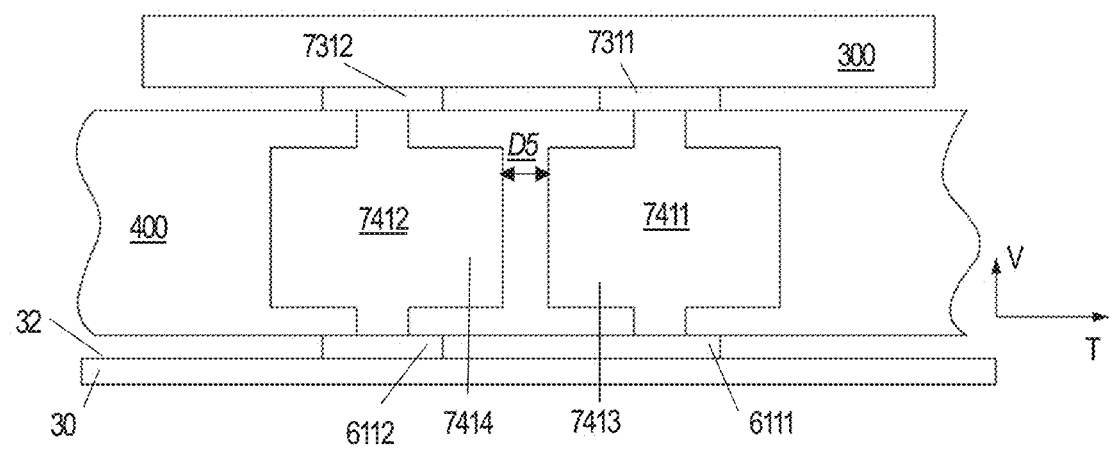
FIG. 7B illustrates a cross-sectional view of a variation of the embodiment shown in FIG. 5B, in accordance with some embodiments.

FIG. 7B illustrates a cross-sectional view of a variation of the embodiment shown in FIG. 5B, in accordance with some embodiments. In FIG. 7B, a first probe pin 7411 connects a first probe card pad 7311 with a first wafer pad 7111, while a second probe pin 7412 connects a second probe card pad 7312 with a second wafer pad 7112. First probe pin 7411 has a first protrusion 7413, while second probe pin 7412 has a second protrusion 7414 that protrudes towards each other transversely. As a result, the distances between probe pins electrically connected to the two probe card pads is reduced. In one example, a nearest distance D5 between protrusions 7413 and 7414 may be 20 μm or less. The first and second protrusions 7413, 7414 may be regarded as a first and second conductive regions, respectively.

FIG. 7A is a partial top view diagram circuit board 300 as shown in FIG. 7B. According to an aspect, probe card pads 7311, 7312 as shown in FIG. 7A may be ground or power pads, where the reduced inductance can help improve the impedance to be closer to the desired impedance values.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A probe card assembly for testing a wafer having a plurality of wafer pads, the probe card assembly comprising:
    a board having a plurality of probe card pads on a surface;
    a first probe pin comprising a first conductive region in contact with a first probe card pad of the plurality of probe card pads and extending in a first direction perpendicular to the surface, the first probe pin configured to contact a wafer pad;
    a second conductive region adjacent the first conductive region and electrically connected to the first probe card pad, wherein the second conductive region is configured to be separated from the wafer pad by a dielectric material when the probe pin contacts the wafer pad.

2. The probe card assembly of claim 1, wherein:
    the second conductive region comprises a first end in contact with the probe card pad.

3. The probe card assembly of claim 2, wherein the second conductive region is a second probe pin shorter in length than the first probe pin, and wherein
    the first probe pin comprises a needle configured to contact the wafer pad, and
    the second probe pin comprises a second end configured to face the wafer pad and be separated from the wafer pad by the dielectric material.

4. The probe card assembly of claim 3, further comprising a bridge connecting the second end of the second probe pin to the first probe pin.

5. The probe card assembly of claim 3, further comprising a guide plate having a first hole and a second hole, wherein the first probe pin is disposed in the first hole and the second probe pin is disposed in the second hole.

6. The probe card assembly of claim 5, wherein
    the second hole is partially-filled with the dielectric material such that the second end of the second probe pin abuts the dielectric material in the second hole.

7. The probe card assembly of claim 6, wherein the guide plate comprises the dielectric material.

8. The probe card assembly of claim 2, wherein the second conductive region is arranged such that a projection of the second conductive region on a surface of the wafer along a direction perpendicular to the surface of the wafer is at least partially outside a boundary of the wafer pad.

9. The probe card assembly of claim 1, wherein the second conductive region is a protrusion on the first probe pin in a second direction parallel to the surface of the board.

10. The probe card assembly of claim 9, wherein the first probe pin has a needle configured to contact the wafer pad, and wherein the needle has a diameter that is smaller than a width of the protrusion along the second direction.

11. The probe card assembly of claim 10, further comprising a guide plate having a through-hole which the first probe pin is disposed therein, wherein the through-hole comprises a shape that conforms to a shape of the protrusion.

12. The probe card assembly of claim 11, wherein a cross section of the shape of the protrusion along a plane parallel to the first direction is rectangular, and wherein the protrusion comprises a planar surface facing away from the surface of the board and configured to be separated from the wafer pad by a dielectric material when the first probe pin contacts the wafer pad.

13. A probe card assembly for testing a wafer having a plurality of wafer pads, the probe card assembly comprising:
    a board having a plurality of probe card pads on a surface;
    a plurality of probe pins extending through a substrate along a first direction perpendicular to the surface;
    a first probe pin of the plurality of probe pins in contact with a first probe card pad of the plurality of probe card pads, and having a needle configured to contact a first wafer pad of the plurality of wafer pads,
    a second probe pin of the plurality of probe pins adjacent the first probe pin, wherein the second probe pin is in contact with a second probe card pad of the plurality of probe card pads, and has a needle configured to contact a second wafer pad of the plurality of wafer pads;
    a conductive region adjacent the first probe pin, the conductive region electrically connected to the first probe card pad, and configured to be separated from the first wafer pad by a dielectric material when the first probe pin contacts the first wafer pad.

14. The probe card assembly of claim 13, wherein the conductive region is disposed in the substrate between the first and second probe pins, and wherein a nearest distance between the conductive region and the second probe pin is less than 50 μm.

15. The probe card assembly of claim 13, wherein
    the conductive region is a third probe pin shorter in length than the first probe pin, the third probe pin comprising a first end in contact with the first probe card pad, and a second end configured to face the first wafer pad and be separated from the first wafer pad by the dielectric material.

16. The probe card assembly of claim 13, wherein the conductive region is a protrusion on the first probe pin in a second direction parallel to the surface of the board.

17. The probe card assembly of claim 13, wherein the substrate is a guide plate having a first hole and a second hole, wherein the first probe pin is disposed in the first hole and the second probe pin is disposed in the second hole.

18. The probe card assembly of claim 13, wherein the second probe card pad is a signal pad, the first probe card pad is a ground pad, and wherein the first probe card pad has a larger area than the second probe card pad.

19. The probe card assembly of claim 13, wherein an inductance between the first probe card pad and the first wafer pad is smaller than an inductance between the first probe card pad and the first wafer pad without the conductive region.

20. The probe card assembly of claim 13, wherein the conductive region is a first conductive region, and the probe card further comprises:
- a second conductive region adjacent the second probe pin and electrically connected to the second probe card pad, wherein the second conductive region is configured to be separated from the second wafer pad by the dielectric material when the second probe pin contacts the second wafer pad, and wherein
- the second conductive region is disposed in the substrate between the second probe pin and the first conductive region.

21. The probe card assembly of claim 20, wherein the first probe card pad is a ground pad, and the second probe card pad is a power pad.

22. An interposer for an automated test equipment (ATE), comprising:
- a substrate having a first surface and a second surface offset in a first direction from the first surface;
- a plurality of spring pins within the substrate and elongated in the first direction;
- a first portion of the plurality of spring pins comprising a first inductance;
- a second portion of the plurality of spring pins comprising a second inductance higher than the first inductance, wherein
- the first portion comprises a conductive region separated from the first surface by a dielectric material.

23. The interposer of claim 22, wherein the conductive region is a short pin that is shorter in length than an adjacent spring pin of the plurality of spring pins, wherein the short pin comprises a first end separated from the first surface of the substrate by the dielectric material, and a second end exposed from the second surface and coplanar with an end of each of the first portion of plurality of spring pins.

24. The interposer of claim 22, wherein the conductive region is a protrusion on a spring pin of the first portion of the plurality of spring pins along a second direction parallel to the first surface.

* * * * *